United States Patent
Yueh et al.

(10) Patent No.: US 7,147,986 B2
(45) Date of Patent: Dec. 12, 2006

(54) RESIST COMPOUNDS INCLUDING ACID LABILE GROUPS ATTACHED TO POLYMERIC CHAINS AT ANHYDRIDE LINKAGES

(75) Inventors: Wang Yueh, Portland, OR (US); Heidi B. Cao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 10/815,606

(22) Filed: Mar. 31, 2004

(65) Prior Publication Data

US 2005/0221219 A1    Oct. 6, 2005

(51) Int. Cl.
*G03F 7/004*    (2006.01)

(52) U.S. Cl. .................. 430/270.1; 430/325; 430/326; 430/330; 430/434; 430/494

(58) Field of Classification Search ............. 430/270.1, 430/325, 326, 330, 434, 494
See application file for complete search history.

(56) References Cited

U.S. PATENT DOCUMENTS

| | | | |
|---|---|---|---|
| 6,303,266 B1 * | 10/2001 | Okino et al. ............. | 430/270.1 |
| 6,451,945 B1 | 9/2002 | Jayaraman et al. | |
| 6,849,381 B1 * | 2/2005 | Barclay et al. .......... | 430/270.1 |
| 2002/0013448 A1 | 1/2002 | Barclay et al. | |
| 2002/0155380 A1 | 10/2002 | Szmanda et al. | |
| 2002/0155383 A1 * | 10/2002 | Fujimori et al. ......... | 430/282.1 |
| 2002/0160302 A1 | 10/2002 | Szmanda et al. | |
| 2002/0173680 A1 | 11/2002 | Szmanda et al. | |
| 2003/0073030 A1 | 4/2003 | Barclay et al. | |
| 2003/0077540 A1 * | 4/2003 | Kodama et al. ......... | 430/270.1 |
| 2003/0207200 A1 | 11/2003 | Barclay et al. | |
| 2003/0215742 A1 | 11/2003 | Barclay et al. | |
| 2003/0224282 A1 | 12/2003 | Barclay et al. | |
| 2005/0079438 A1 | 4/2005 | Cao et al. | |
| 2005/0147916 A1 | 7/2005 | Yueh et al. | |

* cited by examiner

*Primary Examiner*—Barbara L. Gilliam
(74) *Attorney, Agent, or Firm*—Blakely, Sokoloff, Taylor & Zafman LLP

(57) ABSTRACT

A compound including a polymeric chain, and an acid labile group attached to the polymeric chain at an anhydride linkage is disclosed. Compositions including the compound, and methods of using the compositions are also disclosed.

15 Claims, 1 Drawing Sheet

RESIST COMPOUNDS INCLUDING ACID LABILE GROUPS ATTACHED TO POLYMERIC CHAINS AT ANHYDRIDE LINKAGES

BACKGROUND

1. Field

Embodiments of the invention relate to resist compounds including acid labile groups attached to polymeric chains at anhydride linkages, compositions including the compounds, and methods of using the compositions.

2. Background Information

A potential problem with many positive-type chemically amplified resists based on a deprotection imaging mechanism is that the detached deprotection groups generally tend to be hydrophobic, and tend to have a low affinity toward water. As a result, it may be difficult to sufficiently dissolve the detached deprotecting groups in aqueous developer solutions. At least a portion of the non-dissolved deprotection groups may tend to remain after development as particles, scum, residues, or other remnants. These remnants may potentially contribute to defects and decreased manufacturing yields.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

Figure 1:
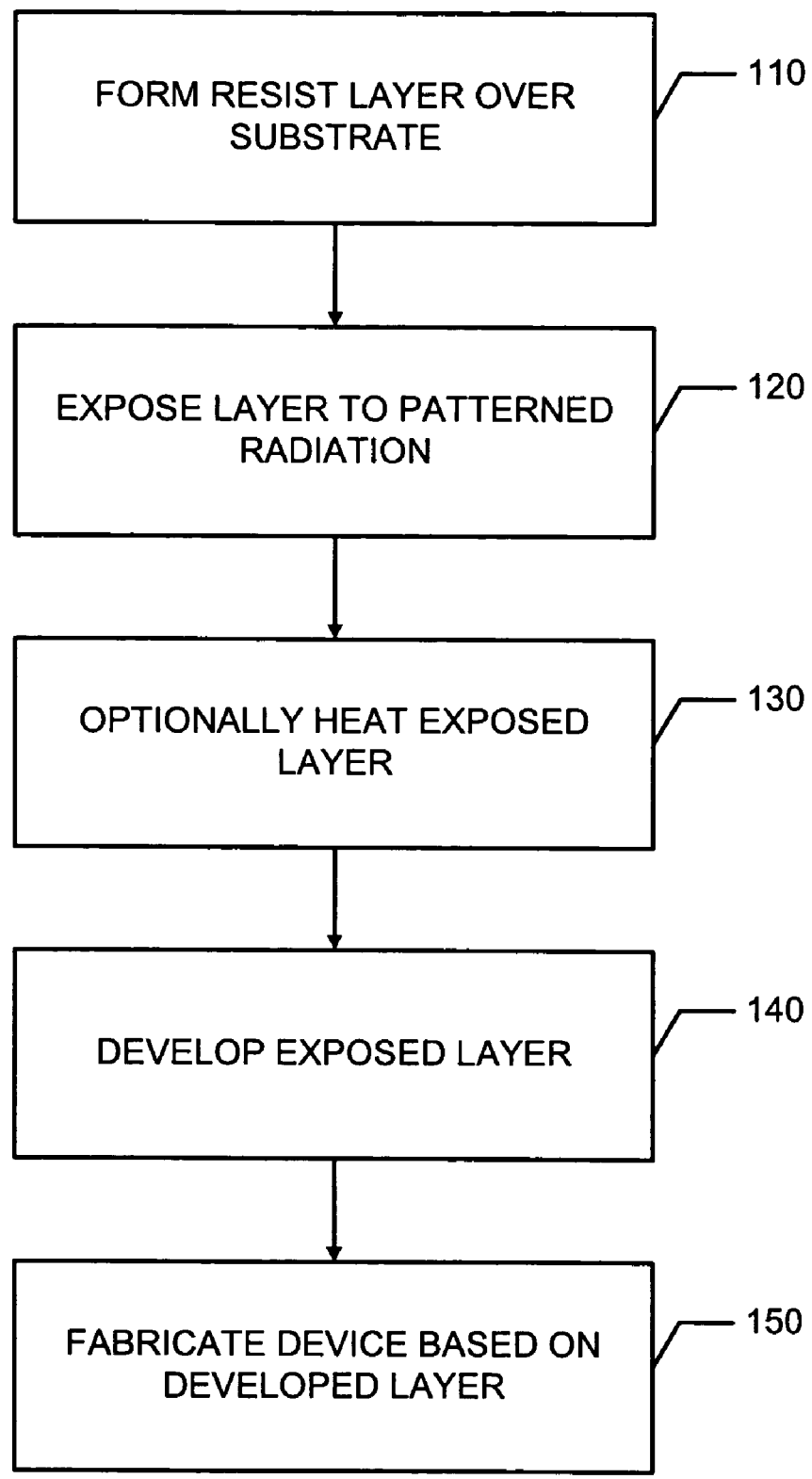
FIG. 1 shows an exemplary method of fabricating a device having miniature components, according to one embodiment of the invention.

In the following description, numerous specific details are set forth. However, it is understood that embodiments of the invention may be practiced without these specific details. In other instances, well-known structures, formulas, and techniques have not been shown in detail in order not to obscure the understanding of this description.

I. Introduction

Chemically amplified resists are currently in widespread use in the manufacture of micro-electronic devices, micro-mechanical devices, micro-electromechanical devices (e.g., micro-electromechanical systems (MEMS)), micro-optical devices, and other devices having miniature components. This may be due at least in part to the good exposure sensitivity that chemical amplification tends to provide. In one aspect, chemical amplification may involve using radiation to generate species, such as acid catalysts, that may promote subsequent chemical transformation of the resist in order to alter the solubility of the resist in a developer.

A common imaging mechanism used in positive-type chemically amplified resists is known in the arts as deprotection or deblocking. In a representative example of deprotection, a base-soluble functionality, such as a carboxylic acid group, may be protected by an acid-labile protecting group. The protection of the acid group may result in a significant decrease in the dissolution rate of the polymer in an alkaline water-based developer.

A radiation-induced deprotection reaction may be employed to cleave or otherwise detach the acid labile protecting group and significantly increase the dissolution rate of the polymer in the alkaline water-based developer. Generally, the resist may be exposed to radiation, for example in lithography, in order to generate a deprotection reaction promoter, such as an acid. The acid may catalyze a deprotection reaction in which the acid labile protecting group is cleaved from the polymeric chain. This may deprotect the carboxylic acid group, or other base-soluble functionality, which may tend to promote dissolution of the polymer in alkaline water-based developer. In this way, the exposed areas of the resist, having the radiation-generated acid catalyst, may be dissolved in the alkaline water-based developer and removed. This may allow positive images or patterns to be formed.

II. Exemplary Resist Compounds

An exemplary resist compound, according to one embodiment of the invention, may have the following chemical formula:

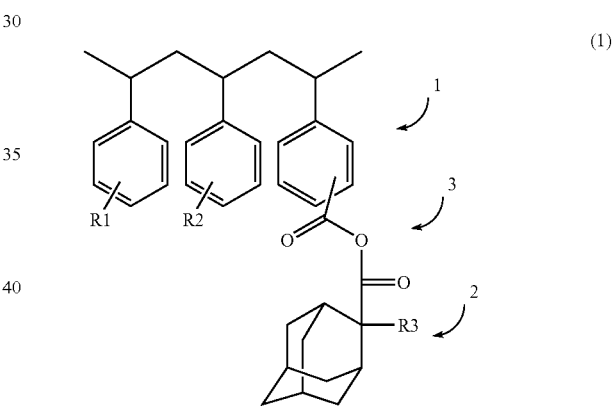

(1)

The resist compound includes a polymeric chain 1, and an acid labile protecting group 2 attached to the polymeric chain at an anhydride linkage 3.

The term "protecting group" generally refers to a group, or other portion of a compound, that may protect or block a functional group of the polymeric chain, such as a carboxylic acid group, to reduce its participation in a reaction, such as an acid-base reaction. In the case of a positive type chemically amplified resist, the protection of the carboxylic acid group, or other base-soluble functionality, may tend to inhibit or at least reduce the rate of dissolution of the polymeric chain in an aqueous alkaline developer. In one aspect, the protecting group may represent a "dissolution inhibitor" to inhibit dissolution of the polymeric chain in an alkaline water-based developer by protecting or blocking the acidic base-soluble functionality. The term "acid labile" generally implies that the group is capable of being changed, for example cleaved or otherwise detached from the chain, by an acid.

The illustrated protecting group includes an adamantyl group. The adamantyl group is an example of a bulky, organic, alicyclic group. The term alicyclic generally refers to a group including one or more rings that are not aromatic. Examples of alicyclic groups include monocyclic rings and polycyclic rings. The adamantyl group includes a polycyclic ring, which is also occasionally known in the arts as a "cage".

Referring to the formula, the illustrated adamantyl group is substituted with $R^3$. Suitable $R^3$ include, but are not limited to, hydrogen, straight or branched alkyl groups having, for example, from about one to five carbon atoms (i.e., $C_{1-5}$ alkyl), straight or branched alkoxy groups having, for example from about one to five carbon atoms, and other electron donating or withdrawing groups. When $R^3$ is hydrogen, the protecting group is known as adamantyl; when $R^3$ is methyl, the protecting group is known as methyl adamantyl, when $R^3$ is ethyl, the protecting group is known as ethyl adamantyl, etc. For convenience, the illustrated adamantyl group will continue to be used to illustrate certain concepts, although embodiments of the invention are not limited to the use of the adamantyl group. As will be explained further below, a wide variety of other acid labile protecting groups may also optionally be employed.

The acid labile adamantyl group is attached to the polymeric chain at an anhydride linkage. An anhydride linkage generally refers to a linkage including two acyl groups bonded to the same oxygen atom or replacement analogue. The term anhydride linkage is also occasionally referred to in the arts as an acid anhydride linkage. Common acyl groups are carboxylic acyl groups that include carbonyl groups. Carboxylic acyl groups may have the formulas:

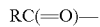  (2)

or

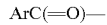  (3)

where R represents an alkyl group, and Ar represents an aryl group.

The illustrated anhydride linkage includes two carboxylic acyl groups, each including a carbonyl group, bonded to the same oxygen atom. A first of the two carboxylic acyl groups is attached to an aryl group, in particular a phenyl group, which is attached to the polymeric chain. The generalized attachment of the acyl group to the aryl group is used to indicate that the acyl group may be attached to various carbon atoms of the phenyl ring. In one aspect, if ring position one is used to represent the connection of the phenyl to the polymeric chain, then suitable ring positions for attachment of the acyl group include any of ring positions two through six. Ring positions three through five, and especially ring position five, tend to be less sterically hindered compared to ring positions two and six.

The second of the two carboxylic acyl groups is attached to the adamantyl group, which is an example of a non-aryl, aliphatic group. The particular point of attachment of the acyl group to the adamantyl group as given in the illustrated compound is not required. In other embodiments of the invention, other ring carbons of the adamantyl group may be attached to the second acyl group. For example, an exemplary resist compound, according to one embodiment of the invention, may have the following chemical formula:

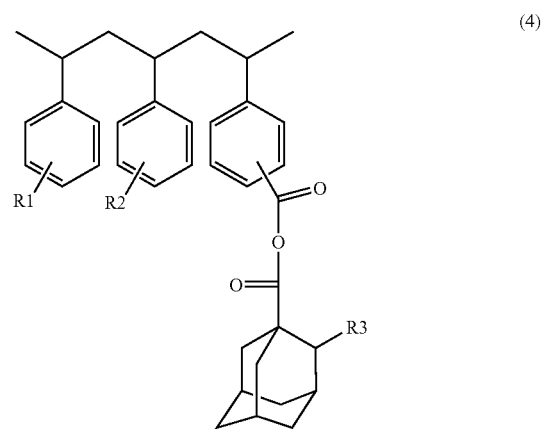

(4)

Now, in the presence of water and an acid catalyst, which may be generated by exposing a photoacid generator (PAG) or other radiation-sensitive acid generator to radiation, for example, the acid labile adamantyl group may be cleaved or otherwise detached from the polymeric chain. This may be accomplished by cleaving or otherwise breaking the anhydride linkage according to the following exemplary deprotection reaction:

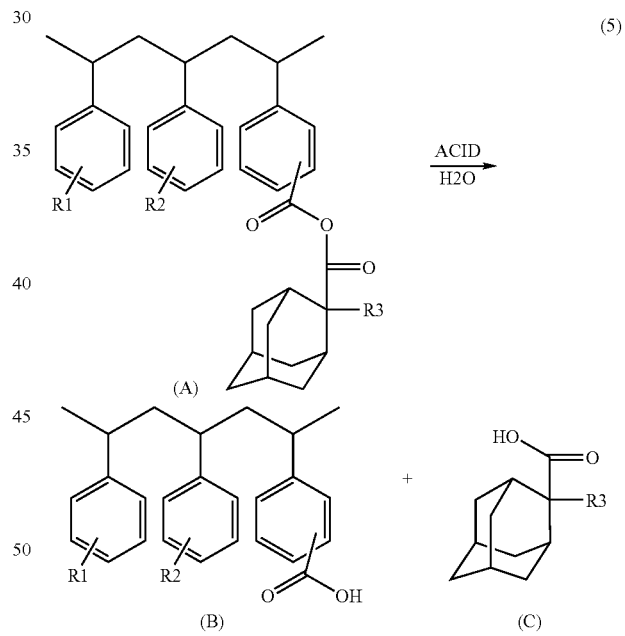

(5)

In this reaction, the acid labile adamantyl group is detached from the polymeric chain of the reactant resist compound (A) by cleavage of the anhydride linkage in an acid-catalyzed hydration reaction. The resist composition may include a sufficient amount of water, for example from about 0.05 to 0.15 wt %, in order to drive the hydration reaction. In one aspect, ambient humidity may provide a sufficient amount of water, which may diffuse into the resist. Depending on the circumstances, it may be appropriate to control the water content and humidity to achieve a consistent reaction rate, which may potentially affect sensitivity, resolution, dissolution rate, critical dimensions, etc. Also, the rate of reaction generally depends, at least in part, on the group $R^3$. An electron-withdrawing group tends to decrease the rate, and an electron-donating group tends to increase the rate.

The products of the reaction include a base-soluble polymeric chain (B), and a detached deprotecting group (C). The base-soluble polymeric chain includes a carboxylic acid group at the point of detachment of the protecting group. The detached deprotecting group also includes a corresponding carboxylic acid group. The regenerated acid catalyst generally tends to be weaker than the initial acid produced by the acid generator, which may tend to limit or quench the deprotection reaction. This may potentially help to control diffusion length and improve resolution.

The detachment of the protecting group, which is also known as deprotection, generally increases the solubility of the polymeric chain in alkaline aqueous or water-based developers. The carboxylic acid group is an example of a base-soluble functionality that may tend to promote dissolution of the polymeric chain in an alkaline water-based developer. In the alkaline developer, the carboxylic acid group may dissolve in water. The carboxylic acid group attached to the adamantyl group may likewise serve as a hydrophilic or base-soluble functionality that may tend to promote increased solubility of the adamantyl group in the alkaline developer. This may tend to reduce the formation of particles, scum, residue, or like remnants, which may potentially contribute to decreased manufacturing yields.

Now, the particular anhydride linkage illustrated is not required. Other acyl groups besides carboxylic acyl groups are known in the arts. Specifically, other suitable acyl groups include, but are not limited to, those including sulfur, and those including phosphorous.

Exemplary acyl groups that include sulfur include, but are not limited to sulfonic acyl groups, sulfinic acyl groups, and carboxylic acyl groups in which the oxygen is replaced with a sulfur analogue. Sulfonic acyl groups may nave the formulas:

$$RS(=O)_2— \tag{6}$$

or $$ArS(=O)_2— \tag{7}$$

Sulfinic acyl groups may have the formulas:

$$RS(=O)— \tag{8}$$

or $$ArS(=O)— \tag{9}$$

A mixed anhydride incorporating both sulfinic and sulfonic acyl groups is called a sulfinic-sulfonic anhydride. Finally, carboxylic acyl groups in which the oxygen is replaced with a sulfur analogue may have the formulas:

$$RC(=S)— \tag{10}$$

or $$ArC(=S)— \tag{11}$$

In one embodiment of the invention, an anhydride linkage may include two potentially different acyl groups of the types described above bonded to the same oxygen atom, or a suitable replacement analogue for oxygen, such as sulfur. Both symmetric anhydrides, in which the acyl groups are of the same type, and mixed anhydrides, in which the acyl groups are of different type, are contemplated.

Considering only carboxylic acyl groups and those including sulfur, for the time being, according to various embodiments of the invention, the following chemical formulas illustrate compounds including a polymeric chain (PC), and an acid labile protecting group (ALG), attached to the chain at a specified anhydride linkage (many of which include sulfur):

$$PC—C(=O)—O—C(=O)-ALG \tag{12}$$

$$PC—C(=O)—O—S(=O)_2-ALG \tag{13}$$

$$PC—C(=O)—O—S(=O)-ALG \tag{14}$$

$$PC—C(=O)—O—C(=S)-ALG \tag{15}$$

$$PC—S(=O)_2—O—C(=O)-ALG \tag{16}$$

$$PC—S(=O)_2—O—S(=O)_2-ALG \tag{17}$$

$$PC—S(=O)_2—O—S(=O)-ALG \tag{18}$$

$$PC—S(=O)_2—O—C(=S)-ALG \tag{19}$$

$$PC—S(=O)—O—C(=O)-ALG \tag{20}$$

$$PC—S(=O)—O—S(=O)_2-ALG \tag{21}$$

$$PC—S(=O)—O—S(=O)-ALG \tag{22}$$

$$PC—S(=O)—O—C(=S)-ALG \tag{23}$$

$$PC—C(=S)—O—C(=O)-ALG \tag{24}$$

$$PC—C(=S)—O—S(=O)_2-ALG \tag{25}$$

$$PC—C(=S)—O—S(=O)-ALG \tag{26}$$

$$PC—C(=S)—O—C(=S)-ALG \tag{27}$$

In the above compounds, as well as in other compounds disclosed herein, PC may be the same as the particular polymeric chain illustrate in chemical formula (1), or different, and likewise, ALG may be the same as the particular acid labile group illustrated in chemical formula (1) or different.

Now turning our attention to phosphorous, exemplary acyl groups that include phosphorous include, but are not limited to phosphoryl groups. A phosphoric anhydride is one in which two phosphoryl groups are bonded to an oxygen atom, or replacement analogue. The phosphoryl groups may nave the formulas:

$$RP(=O)_2— \tag{28}$$

or $$ArP(=O)_2— \tag{29}$$

Considering now phosphorous-containing acyl groups, according to various embodiments of the invention, the following chemical formulas illustrate other compounds including a polymeric chain (PC), and an acid labile protecting group (ALG), attached to the chain at a specified phosphorous-containing anhydride linkage:

$$PC—P(=O)_2—O—C(=O)-ALG \tag{30}$$

$$PC—P(=O)_2—O—S(=O)_2-ALG \tag{31}$$

$$PC—P(=O)_2—O—S(=O)-ALG \tag{32}$$

$$PC—P(=O)_2—O—C(=S)-ALG \tag{33}$$

PC—C(=O)—O—P(=O)₂-ALG (34)

PC—S(=O)₂—O—P(=O)₂-ALG (35)

PC—S(=O)—O—P(=O)₂-ALG (36)

PC—C(=S)—O—P(=O)₂-ALG (37)

Other anhydride linkages include those in which the oxygen atoms bonded to the acyl groups are replaced by sulfur, or other suitable replacement analogues. In the case of sulfur, as used herein, the anhydride linkages will be termed thioanhydride linkages. To further illustrate, according to various embodiments of the invention, the following chemical formulas illustrate further compounds including a polymeric chain (PR), and an acid labile protecting group (ALG) attached to the polymeric chain at a specified thioanhydride linkage:

PC—C(=O)—S—C(=O)-ALG (38)

PC—C(=O)—S—S(=O)₂-ALG (39)

PC—C(=O)—S—S(=O)-ALG (40)

PC—C(=O)—S—C(=S)-ALG (41)

PC—S(=O)₂—S—C(=O)-ALG (42)

PC—S(=O)₂—S—S(=O)₂-ALG (43)

PC—S(=O)₂—S—S(=O)-ALG (44)

PC—S(=O)₂—S—C(=S)-ALG (45)

PC—S(=O)—S—C(=O)-ALG (46)

PC—S(=O)—S—S(=O)₂-ALG (47)

PC—S(=O)—S—S(=O)-ALG (48)

PC—S(=O)—S—C(=S)-ALG (49)

PC—C(=S)—S—C(=O)-ALG (50)

PC—C(=S)—S—S(=O)₂-ALG (51)

PC—C(=S)—S—S(=O)-ALG (52)

PC—C(=S)—S—C(=S)-ALG (53)

Still other thioanhydride linkages include phosphorous. For example, according to various embodiments of the invention, the following chemical formulas illustrate compounds including a polymeric chain (PR), and an acid labile protecting group (ALG) attached to the polymeric chain at a specified phosphorous-containing thioanhydride linkage:

PC—P(=O)₂—S—C(=O)-ALG (54)

PC—P(=O)₂—S—S(=O)₂-ALG (55)

PC—P(=O)₂—S—S(=O)-ALG (56)

PC—P(=O)₂—S—C(=S)-ALG (57)

PC—C(=O)—S—P(=O)₂-ALG (58)

PC—S(=O)₂—S—P(=O)₂-ALG (59)

PC—S(=O)—S—P(=O)₂-ALG (60)

PC—C(=S)—S—P(=O)₂-ALG (61)

Those skilled in the art, and having the benefit of the present disclosure, will appreciate that other anhydride linkages are also contemplated.

Now, let's turn our attention to other protecting groups that may be employed. As previously discussed, the use of adamantyl or alkyl adamantyl as a protecting group is not required. A wide variety of other acid labile protecting groups may also be employed. Suitable acid labile protecting groups include, but are not limited to, bulky organic groups, such as branched alkyl groups, alicyclic groups, and aromatic groups. Suitable branched alkyl groups include, but are not limited to, various branched alkyl groups having, for example, from about four to twenty carbon atoms (i.e., branched $C_{4-20}$ alkyl). Relatively lower molecular weight alkyl esters having less than about four carbon atoms may tend to evaporate or otherwise outgas after deprotection.

Suitable alicyclic groups, in addition to adamantyl and alkyl adamantyl groups, include monocyclic rings, and other polycyclic rings or cages. Exemplary monocyclic rings include, but are not limited to, alkyl cyclopentyl rings and alkyl cyclohexyl rings, where the alkyl groups include short, straight or branched alkyl groups having, for example, from about one to six carbon atoms (i.e., $C_{1-6}$ alkyl). Specific examples include, but are not limited to, methyl cyclopentyl, ethyl cyclopentyl, n-propyl cyclopentyl, iso-propyl cyclopentyl, t-butyl cyclopentyl, n-pentyl-cyclopentyl, methyl cyclohexyl, ethyl cyclohexyl, n-propyl cyclohexyl, iso-propyl cyclohexyl, t-butyl cyclohexyl, and n-pentyl cyclohexyl.

Suitable polycyclic rings or cages include, but are not limited to, alkyl isobornyl, and alkyl norbornyl, where the alkyl groups include short, straight or branched alkyl groups having, for example, from about one to five carbon atoms (i.e., $C_{1-5}$ alkyl). An exemplary short-chain alkyl-substituted cage includes methyl norbornyl.

In various embodiments of the invention, any one of the above-identified acid labile protecting groups may be attached to the polymeric chain at any one of the above-identified anhydride linkages. As one specific example, in an embodiment of the invention, methyl cyclohexyl may be attached to the polymeric chain at an anhydride linkage including sulfur, as given in the following chemical formula:

(62)

As another specific example, in an embodiment of the invention, alkyl (e.g., methyl) norbornyl may be attached to the polymeric chain at an anhydride linkage including phosphorous, as given in the following chemical formula:

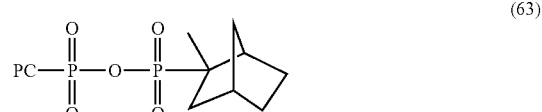

(63)

Literally, numerous other embodiments employing different acid labile protecting groups and different anhydride linkages are contemplated, and will be apparent to those skilled in the art and having the benefit of the present disclosure.

Now the polymeric chain will be discussed in greater detail. Referring again to chemical formula (1), the illustrated polymeric chain includes a generalized representation of a polyhydroxystyrene (PHS) polymeric chain. Suitable groups for $R^1$ include, but are not limited to, hydrogen, straight or branched alkyl groups having, for example, from about one to ten carbon atoms (i.e., $C_{1-10}$ alkyl), alicyclic groups, and hydroxyl groups. The alicyclic group may include a monocyclic ring, such as cyclopentane or cyclohexane. Alternatively, the alicyclic group may include a polycyclic ring, such as adamantyl or norbornyl. Polycyclic rings are also known in the arts as "cages". Suitable groups for $R^2$ include, but are not limited to, hydrogen, straight or branched alkyl groups having, for example, from about one to ten carbon atoms (i.e., $C_{1-10}$ alkyl), alicyclic groups, and hydroxyl groups. Depending upon the wavelength and transparency expectations, halogens may also potentially be employed in $R^1$ and $R^2$.

The illustrated PHS chain is generally suitable for extreme ultraviolet (EUV) lithography, such as at wavelengths of about 13.5 nanometers (nm). Such comparatively short wavelengths may be used to fabricate transistors, MEMS, and other devices having relatively small feature sizes. As is known, a smaller wavelength generally allows a smaller feature size to be fabricated with better resolution.

In one aspect, it is believed that the compounds disclosed herein may be particularly useful in fabricating state-of-the-art transistors, and other devices having very small features. When fabricating such devices it tends to be difficult to sufficiently remove the detached deprotecting groups located at the bottom of small, high-aspect ratio structures, such as contact/via holes. Generally, small amounts of developer tend to reach the bottoms of the small, high-aspect ratio structures. Additionally, many of the commonly employed deprotecting groups tend to be hydrophobic, and tend to have low solubility in water-based developers. As a result, at least a portion of the deprotecting groups may not be removed during development. The remnants may potentially contribute to defects and decreased manufacturing yields.

It is contemplated that the base-soluble acidic groups formed on the detached deprotecting groups may tend to make the deprotecting groups more hydrophilic, and more soluble in the alkaline water-based developer. This may facilitate greater removal of the detached deprotecting groups during development. This may generally to reduce the formation of particles, scum, and other remnants, and may tend to increase manufacturing yields. It may also tend to help improve the resolution of the holes and other small, high-aspect ratio structures.

In addition, the acidic groups may tend to suppress outgassing of the detached deprotecting groups. Outgassing of the deprotected groups may potentially contaminate or damage the exposure optics. In 193 nm and 248 nm lithography, large, bulky, high-boiling point protecting groups, such as methyl adamantyl ester, have commonly been employed in order to reduce the outgassing of the detached deprotecting groups. The exposure in EUV lithography is commonly performed under vacuum. The vacuum may tend to encourage the outgassing of even large, bulky, high-boiling point deprotecting groups, such as methylene adamantane. Experiments by others have confirmed outgassing due to deprotection during exposure.

However, the acid groups formed on the detached deprotecting groups may tend to suppress outgassing of the detached deprotecting groups, even under vacuum. A novel property of the acid group formed on the detached deprotecting group is a capability to form hydrogen bonds with the polymeric chain. Shortly after the cleavage, the acid functional group of the detached deprotecting group may form such hydrogen bonds with an oxygen-containing group of the polymeric chain, for example an acid group. This may tend to reduce outgassing of the detached deprotecting group during the vacuum exposure.

Other embodiments of the invention are not limited to 13.5 nm, or any other known wavelength. In particular, embodiments of the invention are applicable to other actinic radiations, such as other deep ultraviolet (DUV) and extreme ultraviolet (EUV) radiations, that are capable of producing photochemical change in chemical substances, such as resists.

As a first example, another suitable actinic radiation includes one with a wavelength of about 193 nm. An exemplary resist compound suitable for 193 nm lithography, according to one embodiment of the invention, may have the following chemical formula:

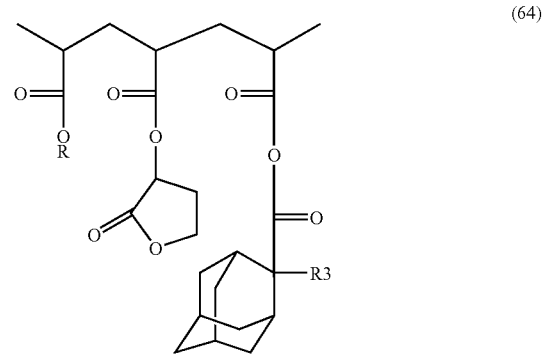

(64)

The resist compound includes a (meth)acrylate polymeric chain, and an acid labile adamantyl group attached to the polymeric chain at an anhydride linkage.

In the formula, suitable groups for R include, but are not limited to, non-aromatic groups, such as hydrogen, straight or branched alkyl groups having, for example, from about one to ten carbon atoms (i.e., $C_{1-10}$ alkyl), straight or branched alkoxy groups having, for example, from about one to ten carbon atoms (i.e., $C_{1-10}$ alkoxy), and non-aromatic rings, such as alicyclic groups. The alicyclic groups may include monocyclic rings, such cyclopentanes or cyclohexanes. Alternatively, the alicyclic groups may include polycyclic rings or cages, such as adamantyls or norbornyls. It is emphasized that the particular illustrated acid labile group and anhydride linkage are not required. Other groups and linkages disclosed herein may also optionally be employed. Additionally, other polymeric chains suitable for 193 nm radiation may also optionally be employed.

Another suitable actinic radiation includes one with a wavelength of about 248 nm. The PHS polymeric chains previously discussed are generally suitable for 248 nm. Other polymers known in the arts are suitable for 157 nm.

III. Exemplary Resist Compositions

In one embodiment of the invention, the resist compounds disclosed herein may be included in a resist composition with one or more other ingredients. Suitable ingredients include, but are not limited to, radiation-sensitive species that are capable of generating acids if exposed to radiation, acid scavengers, surfactants, sensitizers, stabilizers, and dyes.

Suitable radiation-sensitive acid generators that are capable of generating an acid if exposed to radiation include, but are not limited to, iodonium salts, sulfonium salts, and other onium salts; bis(alkylsulfonyl) diazomethanes, bis (cycloalkylsulfonyl) diazomethanes, bis(arylsulfonyl) diazomethanes, and other diazomethanes; oxime sulfonates, nitrobenzylsulfonates, iminosulfonates, disulfones, and organic halogen compounds. Exemplary diazomethanes include, but are not limited to, bis(n-propylsulfonyl)diazomethane, bis(isopropylsulfonyl)diazomethane, bis(n-butylsulfonyl)-diazomethane, bis(isobutylsulfonyl)-diazomethane, bis(tert-butylsulfonyl)diazomethane, and other bis(alkylsulfonyl)diazomethanes each having a straight- or branched-chain alkyl group. Other exemplary diazomethanes include, but are not limited to, bis(cyclopentylsulfonyl)diazomethane, bis(cyclohexylsulfonyl) diazomethane, and other bis(cycloalkylsulfonyl)diazomethanes each having a cyclic alkyl group. Still other exemplary diazomethanes include, but are not limited to, bis(phenylsulfonyl)diazomethane, bis(p-methyphenylsulfonyl)diazomethane, bis(2,4-dimethylphenylsulfonyl)diazomethane, bis(p-methoxyphenylsulfonyl)diazomethane, and other bis (arylsulfonyl)diazomethanes each having a substituted or un-substituted phenyl group. These radiation-sensitive acid generators are also known in the arts as photoacid generators. According to various embodiments of the invention, the radiation-sensitive acid generators may be employed in the resist composition at a concentration of from about 0.1 to 20 weight percent (wt %), 0.5 to 15 wt %, or 1 to 10 wt %.

Some practitioners may find it appropriate to include one or more acid scavengers in the composition. The acid scavengers, which are optional, may tend to improve resolution by adjusting or limiting the diffusion or mobility of the acid. Suitable acid scavengers include, but are not limited to, nitrogen-containing compounds, such as amines, and other basic compounds. Exemplary amines include, but are not limited to, tri-n-butylamine, triethanolamine, and tris(2-methoxyethyl)amine. According to various embodiments of the invention, the acid scavengers may be employed at concentrations of from about 0 to 10 wt %, 0 to 5 wt %, or 0 to 1 wt %.

Some practitioners may find it appropriate to include one or more surfactants in the composition. The surfactants, which are optional, may tend to help improve the wetability of the resist, for example during immersion lithography, development, or both. However, it is contemplated that at least a portion of the surfactants may, at least potentially, contribute to scum. In one aspect, the acid groups resulting from cleavage of the anhydride linkage may be useful to reduce the amount of surfactant. In various aspects, the surfactants may be employed at concentrations of from about 0 to 10 wt %, 0 to 5 wt %, or 0 to 1 wt %.

Some practitioners may find it appropriate to include one or more sensitizers, stabilizers, or dyes in the composition. These components, which are optional, are often included at concentrations of less than about 5 wt %.

To further illustrate, consider several exemplary resist compositions. A resist composition (on a solvent-dry basis), according to one embodiment of the invention, may have the components and concentrations listed in Table 1.

TABLE 1

| Ingredient | Weight Percent (wt %) |
|---|---|
| Resist Compound | 80–99.9 |
| Photoacid Generator | 0.1–20 |
| Acid Scavenger | 0–10 |
| Surfactant | 0–10 |
| Sensitizer | 0–5 |
| Stabilizer | 0–5 |
| Dye | 0–5 |

Another resist composition (on a solvent-dry basis), according to one embodiment of the invention, may have the components and concentrations listed in Table 2.

TABLE 2

| Ingredient | Weight Percent (wt %) |
|---|---|
| Resist Compound | 85–99.5 |
| Photoacid Generator | 0.5–15 |
| Acid Scavenger | 0–5 |
| Surfactant | 0–5 |
| Sensitizer | 0–5 |
| Stabilizer | 0–5 |
| Dye | 0–5 |

Yet another resist composition (on a solvent-dry basis), according to one embodiment of the invention, may have the components and concentrations listed in Table 3.

TABLE 3

| Ingredient | Weight Percent (wt %) |
|---|---|
| Resist Compound | 90–99 |
| Photoacid Generator | 1–10 |
| Acid Scavenger | 0–1 |
| Surfactant | 0–1 |
| Sensitizer | 0–5 |
| Stabilizer | 0–5 |
| Dye | 0–5 |

The compositions disclosed above are given on a solvent-dry basis. Typically, a solvent may be used to dilute the previously described resist compositions prior to use. For example, a composition may include about 20 wt % of the ingredients listed above along with about 80 wt % solvent. In one aspect, this may facilitate application of a smooth and uniform layer. A wide variety of organic solvents may potentially be employed. Depending upon the particular implementation, suitable solvents include, but are not limited to, ether solvents (e.g., ethylene glycol, dipropylene glycol, and propylene glycol methyl ether acetate), ester solvents (e.g., methyl lactate, ethyl acetate, and γ-butyrolactone), ketone solvents (e.g., acetone, methyl isobutyl ketone, and 2-heptanone), and combinations thereof. The solvent is often added prior to shipping to the point of use, although this is not required. Accordingly, other exemplary resist compositions include those given in Tables 1–3 but diluted to about 20 wt % by a solvent.

IV. Exemplary Method of Fabricating Devices Using Resists

FIG. 1 is a block flow diagram of a method 100 of forming a device based on exposure and development of a resist layer, according to one embodiment of the invention. The method includes forming a resist layer over a substrate, at block 110.

The term substrate generally refers to the physical object that is the basic workpiece of which at least a portion is transformed by process operations into the device. Embodiments of the invention are not limited to any known substrate. In one aspect, the substrate may include a wafer. The wafer may include semiconducting, non-semiconducting, or combinations of semiconducting and non-semiconducting materials. In another aspect, the substrate may include metal, plastic, quartz, glass, or other material of which the device is to be fabricated. For example, the substrate may include a plastic from which a micro-mechanical device is to be formed. As another example, the substrate may include a chrome-on-quartz substrate, which may be patterned to form a lithography mask.

In forming the layer over the substrate, at block 110, spin coating, spray coating, roll coating, dip coating, painting, or other application methods known in the arts may optionally be employed to apply a resist composition over or on the substrate. In one aspect, the resist composition may include a resist compound as disclosed elsewhere herein, a radiation-sensitive acid generator capable of generating an acid if exposed to radiation, and optionally one or more solvents, acid scavengers, surfactants, sensitizers, stabilizers, and dyes.

Forming the resist layer over the substrate may further optionally include, after applying the layer, heating or otherwise thermally treating the layer. Depending upon the particular resist composition, this may be used to dry the layer, remove solvents, improve contact with the substrate, or otherwise prepare the layer for subsequent processing.

Then, after any optional thermal treatment, the resist layer may be exposed to patterned radiation, at block 120. In a representative example, a radiation source, such as a lamp or laser, may generate and transmit radiation to the radiation-sensitive layer through a patterned mask, which may pattern the radiation. In one aspect, the radiation may include actinic radiation. Suitable actinic radiations include, but are not limited, deep ultraviolet (DUV) having a wavelength of less than about 250 nm, and extreme ultraviolet (EUV) having a wavelength of less than about 180 nm. Specific examples include those having wavelengths of about 248 nm, 193 nm, 157 nm, and 13.5 nm. The radiation may cause the radiation-sensitive acid generator to generate an acid. Without limitation, the acid generator may undergo photolysis, decomposition, dissociation, or other chemical change, depending upon the particular species, in order to generate the acid. In one embodiment, as in some 13.5 nm implementations, a vacuum exposure may be employed, and in one aspect any potential detached deprotecting groups may tend to hydrogen bond with the polymeric chain, rather than outgas.

Then, the exposed layer may optionally be heated or otherwise thermally treated, at block 130. This is often known in the lithography arts as a post-exposure bake. The thermal treatment may complete an acid-catalyzed deprotection reaction in which the acid labile protecting group may be cleaved or otherwise detached from the polymeric chain. In one aspect, detaching the group may include cleaving an anhydride linkage in a hydrolysis catalyzed by the acid.

Next, after any optional thermal treatment, the layer may be developed, at block 140. Development is also occasionally known in the arts as resist strip. During development, the exposed layer may be contacted with a developer. In one aspect, the developer may include an alkaline water-based solution or other alkaline polar solvent. Suitable alkaline water-based developer solutions include, but are not limited to, aqueous solutions of bases, such as ammonium, dimethylaminomethanol, hydroxylamine, potassium carbonate, potassium hydroxide, sodium carbonate, sodium hydroxide, tetramethylammonium hydroxide (TMAH), (2-hydroxyethyl) trimethylammonium hydroxide (also known as colline), triethylamine, and trimethylhydroxylethylammonium hydroxide. In one embodiment of the invention, a lower than conventional concentration of TMAH or other base may be employed to reduce potential for reaction with anhydride in unexposed portions of resist.

In developing the layer, the polymeric chains and detached deprotecting groups in the exposed portions of the resist may be dissolved in the developer. The acid groups may help to increase the solubility of the detached deprotecting group in the developer. In one aspect, during development, the acid functionality of the detached acid labile group may be dissolved in or reacted with a base of the developer. Then, the developer may be removed, along with the dissolved portions of the layer.

After development, conventional processing may be used to fabricate the device based on the patterned layer, at block 150. In one embodiment of the invention, the device may include a device having miniature components. For example, the device may include a micro-electronic device having miniature electronic circuits (e.g., a microprocessor), micro-mechanical device having miniature mechanical structures, micro-electromechanical devices (e.g., micro-electromechanical systems (MEMS)), or micro-optical device. In another embodiment of the invention, the device may include a lithography mask. Other embodiments of the invention are not so limited. In the case of many devices including miniature components, the conventional processing may include one or more of such well-known operations as etching, doping, diffusion, dielectric deposition, metallization, passivation, electrical test, and assembly. Conventional methods, equipment, and materials may optionally be employed.

V. EXAMPLES

Example 1

Synthesizing Exemplary Resist Compound

This prophetic example shows how to make an exemplary resist compound having a polyhydroxystyrene polymeric chain, and an acid labile adamantly group attached to the polymeric chain at an anhydride linkage, as shown generally in chemical formula (4). In this synthesis, 1-adamantagecarbonyl chloride (CAS No. 2094-72-6; Sigma-Aldrich) may be added dropwise into cold (e.g., 0° C.) 4-vinylbenzoic acid (CAS No. 1075-49-6; Sigma-Aldrich) with trimethylamine in methylene chloride. The temperature of the resulting solution may be gradually increased to room temperature, and the solution may be stirred overnight. Then, the resultant solution may be filtered, and the filtrate may be concentrated with a rotary pump. The concentrated filtrate may be washed with water and extracted with methylene chloride. The organic layer and the extracts may be combined, dried with anhydrous sodium sulfate, and concentrated in a vacuum. Then, the product monomer may be purified by silica gel column chromatography. In a third stage, the product monomer (from the second stage) may be reacted with styrene in a free-radical polymerization reaction with azobisisobutyronitrile (AIBN, CAS No. 78-67-1, Sigma-Aldrich) as catalyst. The resultant polymer may be washed with a mixture of ethyl acetate and hexane in order to precipitate out the polymer.

Example 2

Using Resist Composition for Lithography

This prophetic example shows how to use a resist composition as disclosed herein in lithography. The resist composition may be spin coated on a silicon substrate with a spin rate of about 1000 to 3000 rpm for about 10 to 90 seconds. The coated substrate may be pre-baked by heating to a temperature of about 100 to 180° C. for about 30 to 90 seconds. The thickness of the layer may be from about 100 to 500 nm. The layer may be exposed to 13.5 nm radiation using an exposure tool. The exposed layer may then be post exposure baked by heating to a temperature of about 100 to 190° C. for about 30 to 90 seconds on a hot plate. Then, the baked, exposed layer may be developed by contacting the layer with an aqueous solution of generally less than about 4 wt % TMAH. Next, the developed layer may be washed with de-ionized water, and spin-dried.

VI. Other Matters

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

In the description above, for the purposes of explanation, numerous specific details have been set forth in order to provide a thorough understanding of the embodiments of the invention. It will be apparent, however, to one skilled in the art, that other embodiments may be practiced without some of these specific details. In other instances, well-known structures, formulas, devices, and techniques have been shown in block diagram form or without detail in order not to obscure the understanding of this description.

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

In the claims, any element that does not explicitly state "means for" performing a specified function, or "step for" performing a specified function, is not to be interpreted as a "means" or "step" clause as specified in 35 U.S.C. Section 112, Paragraph 6. In particular, any use of "step of" in the claims herein is not intended to invoke the provisions of 35 U.S.C. Section 112, Paragraph 6.

What is claimed is:

1. A compound comprising:
   a polymeric chain;
   a dissolution inhibitor group attached to the polymeric chain at an anhydride linkage, wherein the anhydride linkage comprises sulfur, and wherein the anhydride linkage comprises a sulfinic acyl group.

2. The compound of claim 1, wherein the dissolution inhibitor group comprises an alicyclic group.

3. The compound of claim 2, wherein the alicyclic group comprises a ring selected from an alkylated monocyclic ring and an alkylated polycyclic ring.

4. The compound of claim 3, wherein the alicyclic group comprises a group selected from methyl cyclopentyl, methyl cyclohexyl, methyl adamantyl, and norbornyl.

5. A composition comprising:
   the compound of claim 1; and
   a radiation sensitive acid generator capable of generating an acid if exposed to radiation.

6. A method comprising:
   forming a layer of the composition of claim 5 over a substrate;
   exposing the layer to patterned radiation;
   heating the exposed layer; and
   developing the exposed layer.

7. A compound comprising:
   a polymeric chain;
   a dissolution inhibitor group attached to the polymeric chain at an anhydride linkage, wherein the anhydride linkage comprises sulfur, and wherein the anhydride linkage comprises two acyl groups bonded to a sulfur atom.

8. A compound comprising:
   a polymeric chain; and
   a dissolution inhibitor group attached to the polymeric chain at an anhydride linkage, wherein the anhydride linkage comprises phosphorous.

9. The compound of claim 8, wherein the anhydride linkage comprises a phosphoryl acyl group.

10. A compound comprising:
    a polymeric chain including polyhydroxystyrene;
    a dissolution inhibitor attached to the polyhydroxystyrene of the polymeric chain at an anhydride linkage.

11. The compound of claim 10, wherein the anhydride linkage comprises two acyl groups bonded to an oxygen atom, wherein a first of the two acyl groups is attached to the polymeric chain, and wherein a second of the two acyl groups is attached to the dissolution inhibitor.

12. The compound of claim 10, wherein the anhydride linkage comprises sulfur.

13. The compound of claim 10, wherein the anhydride linkage comprises phosphorous.

14. A composition comprising on a solvent-dry basis:
    from 80 to 99.9 weight percent of the compound of claim 10; and
    from 0.1 to 20 weight percent of a photoacid generator.

15. A method comprising:
    forming a layer of the composition of claim 14 over a substrate;
    exposing the layer to patterned radiation;
    heating the exposed layer; and
    developing the exposed layer.

* * * * *